United States Patent
Cayci et al.

(10) Patent No.: US 11,381,080 B2
(45) Date of Patent: Jul. 5, 2022

(54) FREQUENCY ADAPTIVE HARMONIC CURRENT GENERATOR

(71) Applicant: TUBITAK, Ankara (TR)

(72) Inventors: Huseyin Cayci, Kocaeli (TR); Kaan Gulnihar, Kocaeli (TR); Tansu Kefeli, Kocaeli (TR)

(73) Assignee: TUBITAK, Ankara (TR)

( * ) Notice: Subject to any disclaimer, the term of this patent is extended or adjusted under 35 U.S.C. 154(b) by 533 days.

(21) Appl. No.: 16/464,282

(22) PCT Filed: Dec. 21, 2017

(86) PCT No.: PCT/IB2017/058280
§ 371 (c)(1),
(2) Date: May 27, 2019

(87) PCT Pub. No.: WO2018/122701
PCT Pub. Date: Jul. 5, 2018

(65) Prior Publication Data
US 2020/0099223 A1 Mar. 26, 2020

(30) Foreign Application Priority Data

Dec. 30, 2016 (TR) .............. TR2016/20326

(51) Int. Cl.
*H02J 3/01* (2006.01)
*G01R 1/20* (2006.01)
(Continued)

(52) U.S. Cl.
CPC ............... *H02J 3/01* (2013.01); *G01R 1/203* (2013.01); *G01R 15/04* (2013.01); *G01R 19/2513* (2013.01)

(58) Field of Classification Search
CPC ............ H02J 3/01; G01R 1/203; G01R 15/04; G01R 19/2513; G01R 23/20; G01R 31/2841; Y02E 40/40
See application file for complete search history.

(56) References Cited

U.S. PATENT DOCUMENTS 5,499,178 A 3/1996 Mohan
5,656,924 A 8/1997 Mohan et al.
(Continued)

FOREIGN PATENT DOCUMENTS

CN 1428611 A * 7/2003
CN 102857087 A * 1/2013
(Continued)

OTHER PUBLICATIONS

BR Automation, "Panel PC 900 multi-touch", 2015, web.archive.org/web/20150603152603/https://www.br-automation.com/en-us/products/industrial-pcs/panel-pc-900-multi-touch/ (Year: 2015).*

*Primary Examiner* — Tarun Sinha
*Assistant Examiner* — Yossef Korang-Beheshti
(74) *Attorney, Agent, or Firm* — Bayramoglu Law Offices LLC

(57) ABSTRACT

A frequency adaptive harmonic current generator, including a microcontroller board (15) used for controlling the generation of harmonic currents and frequency adaptive operating function; an electronic relay (11) controlled and switched over the digital output of the microcontroller (21), the resistor (23) and the transistor (24); a data collection unit (13) to which the voltage divider (5), the buffer (6) and the current shunt (8) are connected for the measurement of voltage and current harmonics and which reads the current and voltage values and transfers such values to the panel type computer (14); and a panel type computer (14) which includes software for making, presenting and recording the measurements, the external connections of which are
(Continued)

ensured by USB connectors (18) and a LAN connector (19), which displays the measurement values to the user, and which has push-button (20) for switching on/off operations.

15 Claims, 11 Drawing Sheets

(51) Int. Cl.
*G01R 15/04* (2006.01)
*G01R 19/25* (2006.01)

(56) References Cited

U.S. PATENT DOCUMENTS

| | | | |
|---|---|---|---|
| 5,754,440 A | 5/1998 | Cox et al. | |
| 6,472,775 B1 | 10/2002 | Huang et al. | |
| 7,511,468 B2 | 3/2009 | McEachern et al. | |
| 2006/0171182 A1* | 8/2006 | Siri | H02M 3/33592 363/131 |
| 2006/0284681 A1* | 12/2006 | Pollock | G01R 1/06766 330/284 |
| 2010/0164579 A1* | 7/2010 | Acatrinei | H02M 1/4208 327/172 |
| 2013/0033907 A1* | 2/2013 | Zhou | H02J 3/01 363/37 |
| 2013/0342950 A1* | 12/2013 | Westrick, Jr. | H01H 47/22 361/170 |
| 2015/0381057 A1* | 12/2015 | Luu | H02M 3/337 363/21.01 |

FOREIGN PATENT DOCUMENTS

| | | | |
|---|---|---|---|
| CN | 103018612 A | * | 4/2013 |
| CN | 103516217 A | * | 1/2014 |
| CN | 205123259 U | * | 3/2016 |
| JP | H0684088 A | * | 3/1994 |

* cited by examiner

FREQUENCY ADAPTIVE HARMONIC CURRENT GENERATOR

CROSS REFERENCE TO THE RELATED APPLICATIONS

This application is the national phase entry of International Application No. PCT/IB2017/058280, filed on Dec. 21, 2017, which is based upon and claims priority to Turkish Patent Application No. TR2016/20326, filed on Dec. 30, 2016, the entire contents of which are incorporated herein by reference.

TECHNICAL FIELD

The invention relates to a frequency adaptive harmonic current generator.

The invention more particularly relates to a frequency adaptive harmonic current generator developed for generating and measuring defined, steady and high-accuracy current harmonics.

BACKGROUND

In power plants, the generators generate electricity in alternating form. The generated alternating voltage is sinusoidal, i.e. in sinus form. The reason for this is that less harmonic current is generated. In case of excessive harmonic current, on the other hand, too much energy is lost during power transmission and distribution.

Several techniques have been developed in order to reduce the effect of the harmonic currents leading to energy loss.

The U.S. Pat. No. 7,511,168 filed on 20 Nov. 2006 within the state of the art discloses a portable instrument for performing in-situ harmonic voltage measurements and harmonic current measurements on alternating current (AC) power conductors. This instrument is designed for in-situ use and a current source is disposed for the calibration of measurement modules inside the instrument prior to use.

Another document in the state of the art is the U.S. Pat. No. 5,656,924 filed on 27 Oct. 1995, wherein a system developed for providing harmonic currents to a harmonic generator connected to a multiphase alternating current power system is disclosed. This system includes a zig-zag transformer and a current generator. This device is designed for reducing harmonics in a harmonic generating load.

The fact that there exists no device that generates, measures harmonics and performs such operations without being dependent on a given frequency has deemed it necessary to develop the frequency adaptive harmonic current generator according to the invention.

SUMMARY

The object of the present invention is to provide a frequency adaptive harmonic current generator.

Another object of the present invention is to provide a frequency adaptive harmonic current generator which allows measuring current harmonics as well as generating them.

Another object of the present invention is to provide a frequency adaptive harmonic current generator having two separate electrical inputs and enabling the generation and measurement of current harmonics to be more stable and of higher quality.

Another object of the present invention is to provide a frequency adaptive harmonic current generator which has a measurement module for monitoring the generated harmonics.

And another object of the present invention is to provide a frequency adaptive harmonic current generator which comprises a microcontroller based circuit and an embedded software.

The current generator according to the invention is designed for generating defined harmonic currents and monitoring the measured values. At the same time, due to the frequency adaptive nature thereof, it can be used for generating and measuring harmonic currents from power supplies in the frequency range of 45-65 Hz.

BRIEF DESCRIPTION OF THE DRAWINGS

The frequency adaptive harmonic current generator developed for achieving the objects of the present invention is illustrated in the accompanying drawings,
in which.

The parts shown in the drawings are enumerated individually and the corresponding reference numerals thereto are given below.

Figure 1:
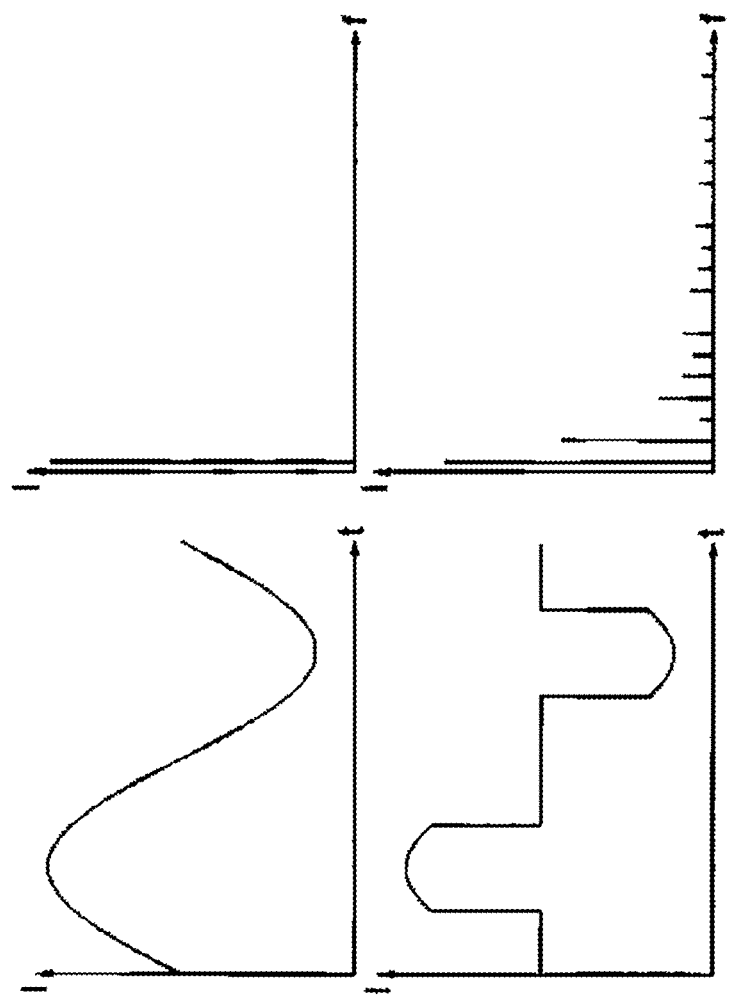
FIG. 1 is the graph showing the defined current harmonics generated by resistive switching technique.

1. Main power input
2. Power on/off switch

3. Harmonic current withdrawal input
4. Harmonic on/off switch
5. Voltage divider
6. Buffer
7. Rectifier
8. Current shunt
9. High voltage diode
10. TVS diode
11. Electronic relay
12. Resistive load
13. Data collection unit
14. Panel type computer
15. Microcontroller board
16. Switching mode power supplies
17. Cooling fans
18. USB connector
19. LAN connector
20. Button
21. Microcontroller
22. Voltage comparator
23. Resistor
24. Transistor

DETAILED DESCRIPTION OF THE EMBODIMENTS

The frequency adaptive harmonic current generator according to the invention comprises:
 a microcontroller board (15) used for controlling the generation of harmonic currents and frequency adaptive operating function,
 an electronic relay (11) controlled and switched over the digital output of the microcontroller (21), the resistor (23) and the transistor (24),
 a data collection unit (13) to which the voltage divider (5), the buffer (6) and the current shunt (8) are connected for the measurement of voltage and current harmonics and which reads the current and voltage values and transfers such values to the panel type computer (14), and
 a panel type computer (14) which includes software for making, presenting and recording the measurements; the external connections of which are ensured by USB connectors (18) and a LAN connector (19); which displays the measurement values to the user; and whit as push-button (20) for switching on/off operations.

The invention is a frequency adaptive harmonic current generator; wherein it comprises a main power input (1) used to supply the switching mode power supplies (16) and cooling fans (17).

The invention is a frequency adaptive harmonic current generator; wherein it comprises a harmonic current withdrawal input (3) that permits applying voltage sources with different voltage and frequency values.

The invention is a frequency adaptive harmonic current generator; wherein it comprises a harmonic on/off switch (4) used for switching on/off the generation of current harmonics.

The invention is a frequency adaptive harmonic current generator; wherein it comprises a bridge type rectifier (7) between the harmonic current withdrawal input (3) and the resistive load (12) in order to generate unidirectional currents at resistive load (12) side.

The invention is a frequency adaptive harmonic current generator; wherein it comprises a power on/off switch (2), which serves as the main on/off switch of the generator.

The current withdrawn by the resistive load (12) connected to the source generating sinusoidal voltage will also be sinusoidal. The main operating principle of the invention is based on the activation/deactivation of the resistive load (12) at each period of the voltage varying in a time-dependent manner and in suitable times, by switching. As a result of this technique, defined current harmonics are generated (FIG. 1).

When the load is resistive, the withdrawn current is sinusoidal. In the display of the current in frequency domain, only base frequency component is seen. When resistive load (12) switching technique is applied, the current signal is chopped and is no longer sinusoidal. The withdrawn current in this case comprises many harmonic components.

A high-power resistive load (12) is used in the system to generate steady currents. A bridge type rectifier (7) is provided between the harmonic current withdrawal input (3) and the resistive load (12) in order to generate unidirectional currents at resistive load (12) side of the system. Again at the resistive load (12) side of the system, a high voltage diode (9) and a TVS diode (10) are connected for protection.

A microcontroller (21) based electronic circuit is used for switching. This circuit detects zero crossing points and precisely measures the period of the voltage signal using the internal timer thereof. The stability of the current harmonics to be generated is dependent on the switching timing of the resistive load (12). To that end, a timer disposed in the microcontroller (21) starts to count at each zero crossing of the voltage signal and the electronic relay (11) connected to the resistive load (12) is switched at time points determined according to the counter value.

The output of the main voltage divider (5) is connected to the input of the voltage divider (5) disposed in the microcontroller board (15). What is intended here is to lower the voltage signal to a suitable level prior to applying the same to the voltage comparator (22). Zero crossing detector circuit is formed by the voltage comparator (22) and the resistor (23). The output of the voltage comparator (22) is connected to a digital input of an 8051 based microcontroller (21). A digital output of the microcontroller (21) controls the electronic relay (11) through a resistor (23) and a transistor (24). The entire electronic circuit is supplied by 5V DC voltage.

The precisely measured time period value of the voltage signal is used for frequency adaptive operating function. The only way to generate the same current harmonics at different frequencies is that the duty cycle of the electronic relay (11) switching signal is steady. Electronic relay (11) switching timing is calculated again for each period based on the previous value of the voltage signal period. Therefore, the durations in which the resistive load (12) is activated are variable, not stable. During this calculation, however, the duty cycle, i.e. the ratio between the measured time period and the time during which the resistive load (12) is activated, is kept stable. The triggering timing of the electronic relay (11) changes as a result of a change in the voltage source frequency, but not the triggering signal duty cycle (FIG. 2).

Figure 2:
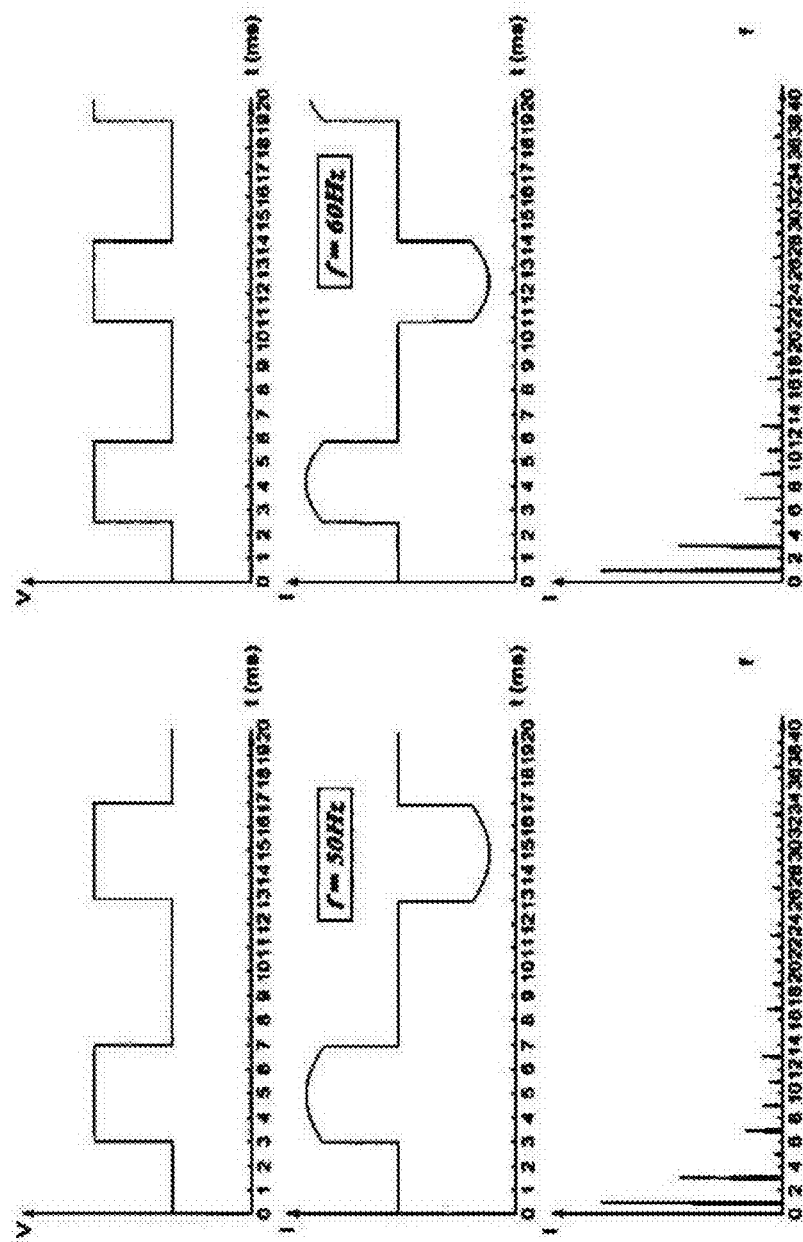
FIG. 2 is the graph showing the change in the triggering signal of the electronic relay depending on the change in the frequency of the applied voltage, and thus the stability of the generated current harmonics.

It is seen at the top of FIG. 2 that the electronic relay (11) switching signal changes depending on the voltage source frequency. The fact that the duty cycle remains steady also makes the generated current harmonics steady. This is shown in the frequency domain.

A precise current shunt (8) and a precise voltage divider (5) are provided in the invention so as to perform measurements. The voltage divider (5), the buffer (6) and the current shunt (8) are connected to the data collection unit (13) inputs for the measurement of voltage and current harmonics. The data collection unit (13) is connected to the panel type computer (14) via USB connection line. The software produced for making, presenting and recording the measurements is run by this panel type computer (14).

A data collection unit (13) reads the current and voltage values, and then transfers such values to the panel type computer (14). These data are processed and presented to the user. USB connectors (18) and an LAN connector (19) are provided for external connections of the panel type computer (14). A push-button (20) is disposed for starting/ shutting down the panel type computer (14).

The main power input (1), on the other hand, is used to supply the switching mode power supplies (16) and cooling fans (17). It must be connected to a 230V/50 Hz network. The power on/off switch (2) serves as the main on/off switch of the generator according to the invention.

The frequency adaptive harmonic current generator is designed for generating and measuring defined, steady and high-accuracy current harmonics.

One of the main characteristics of the invention is that the current harmonics can be measured in addition to being generated. The second important characteristic is the frequency adaptive operation. Commercially available harmonic generators may be used in a single determined network frequency (e.g. 50 Hz). The invention, on the contrary, can be used with voltage sources in the frequency range of 45-65 Hz and it can continuously generate and measure the same current harmonics.

A third important characteristic is the provision of separate electrical power inputs. The invention has two individual electrical power inputs: one main power input (1) to supply the internal systems and one harmonic current withdrawal input (3) for the connection of the voltage source from which the current harmonics will be withdrawn. Thanks to this property, the generation and measurement of current harmonics can be more steady and of higher quality. Additionally, the fact that an individual harmonic current withdrawal input (3) from which current harmonics will be withdrawn permits applying voltage sources with different voltage and frequency values to said input. In fact, this voltage source is not entirely sinusoidal, but it may be a source applying voltage harmonics, During the whole process, the main power input (1) used to supply the internal systems enables the invention to operate steadily based on the stable network voltage. The harmonic current withdrawal input (3) must he connected to the power supply or network from which current harmonics will be withdrawn.

Once the development process of the present invention has been completed, many experimental measurements have been made. Exemplary measurement results are given in FIGS. 3, 4, 5 and Table 1. Different trademark measurement instruments are used for this experimental comparison measurements.

Figure 3:
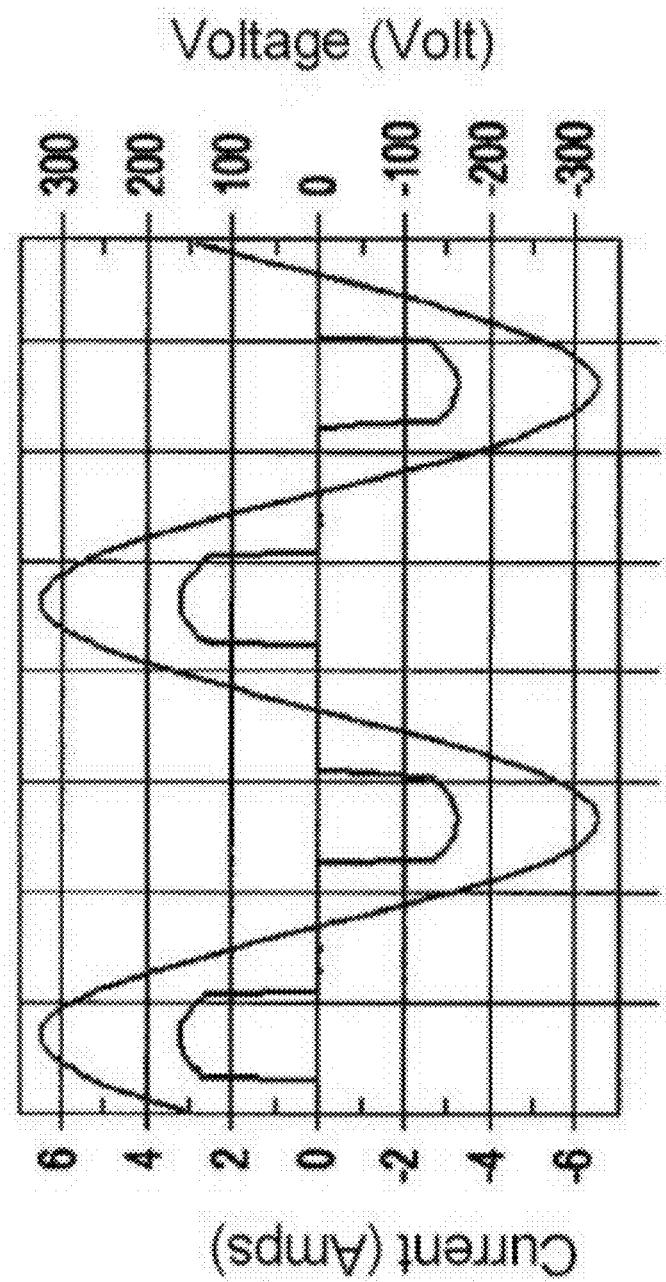
FIG. 3 is the graph showing the voltage applied by a different trademark device source and the current drawn by the invention from such source.

The graph illustrated in FIG. 3 shows the voltage applied by a different trademark source and the current drawn by the invention from such source. The applied voltage is 230 V (RMS), 50 Hz.

Figure 4:
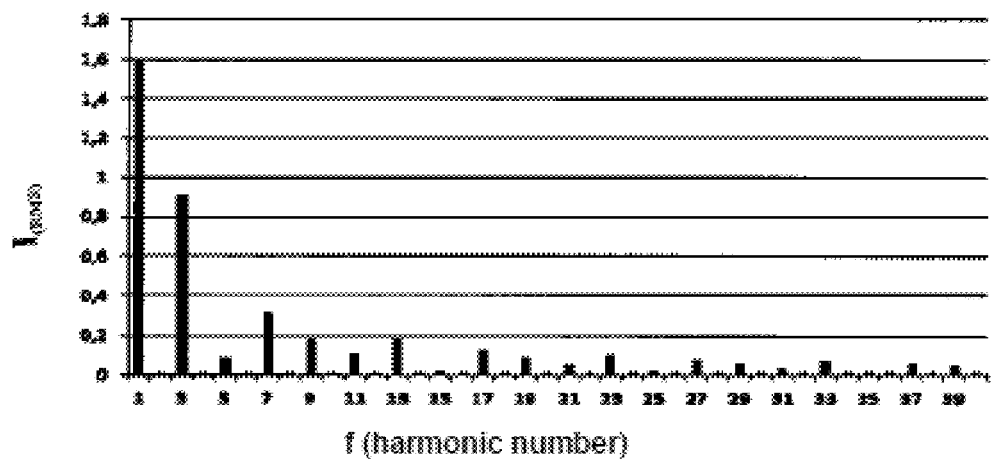
FIG. 4 is the graph showing the results of the measurement from a different trademark device.
Figure 5:
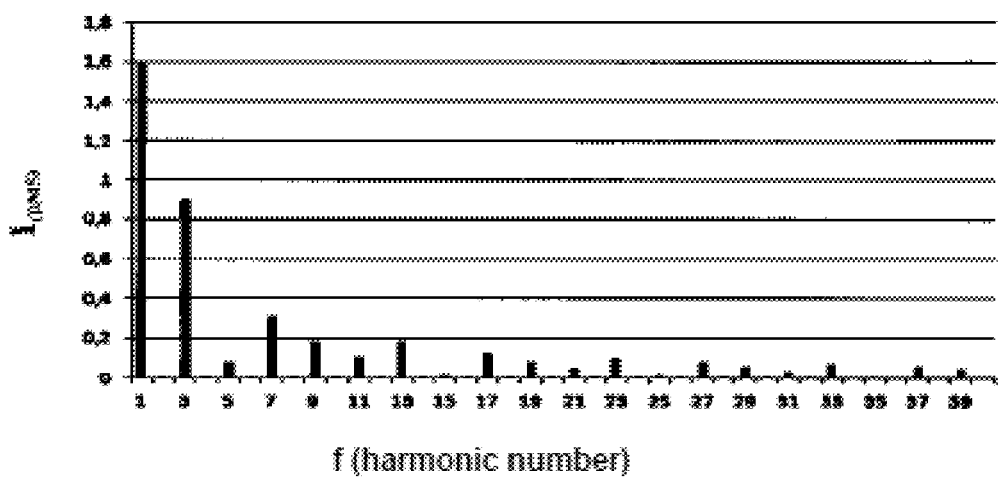
FIG. 5 is the graph showing the results of the measurement from the current generator according to the invention.

The comparison of the measurement results obtained with the invention itself and with different trademark measurement instruments regarding the generated current harmonics by the invention are shown in FIGS. 4 and 5. FIG. 4 shows the measurement results from a different trademark device while FIG. 5 illustrates the measurement results from the invention.

The current harmonics measurement results shown in FIGS. 4 and 5 are also given in Table 1. The maximum difference between the measurement results of the two systems is lower than 0.1%.

TABLE 1

| Harmonic No. | TESEQ NSG 1007-45 | | Frequency Adaptive Harmonic Current Generator | | | |
|---|---|---|---|---|---|---|
| | Current ($I_{RMS}$ amp) | Current (%) | Current ($I_{RMS}$ amp) | Current (%) | Difference ($I_{RMS}$ amp) | Difference (%) |
| 1 | 1.596 | 100.00 | 1.5859 | 100.00 | 0.0101 | 0.00 |
| 2 | 0.003 | 0.19 | 0.0022 | 0.14 | 0.0008 | 0.05 |
| 3 | 0.908 | 56.89 | 0.9034 | 56.96 | 0.0046 | -0.07 |
| 4 | 0.002 | 0.13 | 0.0015 | 0.09 | 0.0005 | 0.03 |
| 5 | 0.083 | 5.20 | 0.0831 | 5.24 | -0.0001 | -0.04 |
| 6 | 0.001 | 0.06 | 0.0014 | 0.09 | -0.0004 | -0.03 |
| 7 | 0.311 | 19.49 | 0.3093 | 19.50 | 0.0017 | -0.02 |
| 8 | 0.002 | 0.13 | 0.0022 | 0.14 | -0.0002 | -0.01 |
| 9 | 0.182 | 11.40 | 0.1812 | 11.43 | 0.0008 | -0.02 |
| 10 | 0.001 | 0.06 | 0.0007 | 0.04 | 0.0003 | 0.02 |
| 11 | 0.105 | 6.58 | 0.1046 | 6.60 | 0.0004 | -0.02 |
| 12 | 0.002 | 0.13 | 0.0021 | 0.13 | -0.0001 | -0.01 |
| 13 | 0.179 | 11.22 | 0.1782 | 11.24 | 0.0008 | -0.02 |
| 14 | 0.002 | 0.13 | 0.0015 | 0.09 | 0.0005 | 0.03 |
| 15 | 0.020 | 1.25 | 0.0195 | 1.23 | 0.0005 | 0.02 |
| 16 | 0.001 | 0.06 | 0.0013 | 0.08 | -0.0003 | -0.02 |
| 17 | 0.126 | 7.89 | 0.1250 | 7.88 | 0.0010 | 0.01 |
| 18 | 0.002 | 0.13 | 0.0022 | 0.14 | -0.0002 | -0.01 |
| 19 | 0.086 | 5.39 | 0.0852 | 5.37 | 0.0008 | 0.02 |
| 20 | 0.001 | 0.06 | 0.0007 | 0.04 | 0.0003 | 0.02 |
| 21 | 0.053 | 3.32 | 0.0524 | 3.30 | 0.0006 | 0.02 |
| 22 | 0.002 | 0.13 | 0.0021 | 0.13 | -0.0001 | -0.01 |
| 23 | 0.101 | 6.33 | 0.1004 | 6.33 | 0.0006 | 0.00 |
| 24 | 0.002 | 0.13 | 0.0016 | 0.10 | 0.0004 | 0.02 |
| 25 | 0.014 | 0.88 | 0.0143 | 0.90 | -0.0003 | -0.02 |
| 26 | 0.001 | 0.06 | 0.0012 | 0.08 | -0.0002 | -0.01 |
| 27 | 0.077 | 4.82 | 0.0770 | 4.86 | 0.0000 | -0.03 |
| 28 | 0.002 | 0.13 | 0.0022 | 0.14 | -0.0002 | -0.01 |
| 29 | 0.058 | 3.63 | 0.0576 | 3.63 | 0.0004 | 0.00 |

TABLE 1-continued

| Harmonic No. | TESEQ NSG 1007-45 | | Frequency Adaptive Harmonic Current Generator | | | |
|---|---|---|---|---|---|---|
| | Current ($I_{RMS}$ amp) | Current (%) | Current ($I_{RMS}$ amp) | Current (%) | Difference ($I_{RMS}$ amp) | Difference (%) |
| 30 | 0.001 | 0.06 | 0.0007 | 0.04 | 0.0003 | 0.02 |
| 31 | 0.033 | 2.07 | 0.0329 | 2.07 | 0.0001 | −0.01 |
| 32 | 0.002 | 0.13 | 0.0020 | 0.13 | 0.0000 | 0.00 |
| 33 | 0.070 | 4.39 | 0.0701 | 4.42 | −0.0001 | −0.03 |
| 34 | 0.002 | 0.13 | 0.0017 | 0.11 | 0.0003 | 0.02 |
| 35 | 0.013 | 0.81 | 0.0128 | 0.81 | 0.0002 | 0.01 |
| 36 | 0.001 | 0.06 | 0.0011 | 0.07 | −0.0001 | −0.01 |
| 37 | 0.055 | 3.45 | 0.0547 | 3.45 | 0.0003 | 0.00 |
| 38 | 0.002 | 0.13 | 0.0022 | 0.14 | −0.0002 | −0.01 |
| 39 | 0.045 | 2.82 | 0.0444 | 2.80 | 0.0006 | 0.02 |
| 40 | 0.001 | 0.06 | 0.0008 | 0.05 | 0.0002 | 0.01 |

The invention has an innovative characteristic, the so-called frequency adaptiveness. The system can adapt itself to the frequency of the applied voltage. Thus, the generated current harmonics are always steady and maintain the same value.

Experimental measurements for testing the performance of the frequency adaptive operation feature have been conducted. To that end, different trademark and model power supplies have been used. This power supply can generate electrical power at the desired frequency value, at the same time applying voltage harmonics.

230 V (RMS) voltage value along with various voltage harmonics has been applied to the invention. This process has been repeated at two different standard network frequencies: 50 and 60 Hz.

Figure 7:
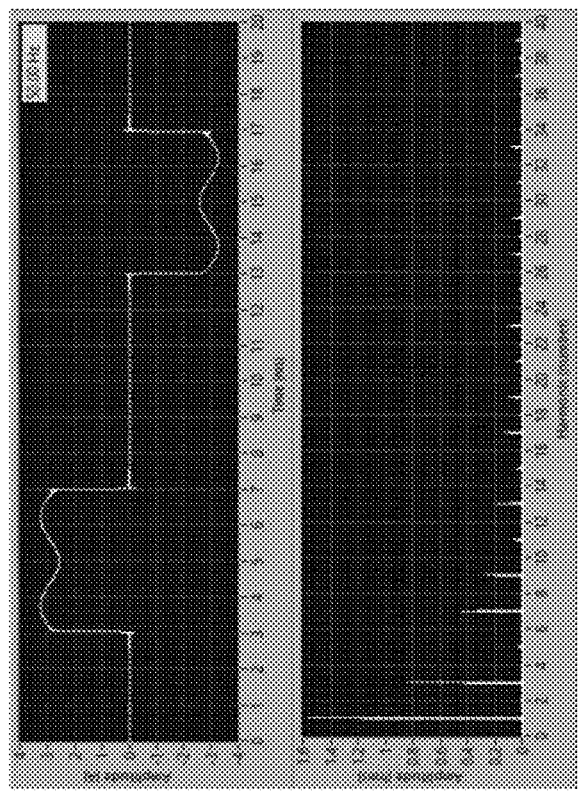
FIG. 7 is the graph showing the current harmonics generated from the current generator according to the invention (for the voltage in FIG. 6).
Figure 6:
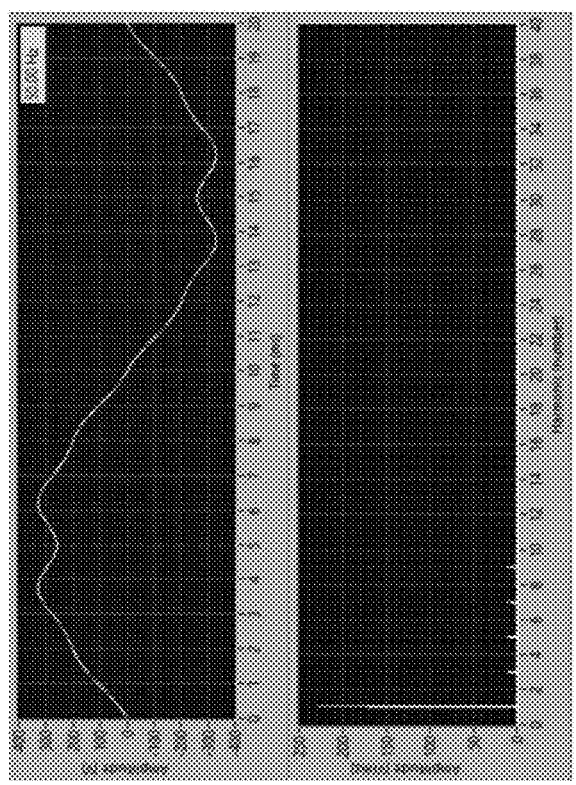
FIG. 6 is the graph showing the application of various voltage harmonics at 230 V (RMS) voltage, 50 Hz base frequency to the current generator according to the invention.

As seen in FIG. 6, 230 V (RMS) voltage has been applied to the invention along with various voltage harmonics at 50 Hz base frequency. The generated current harmonics are seen in FIG. 7. Moreover, the applied voltage and the withdrawn current are also shown in Table 2 and Table 3, respectively.

TABLE 2

| Harmonic | Mag. (Vrms) | Mag. (%) | Phase (deg) |
|---|---|---|---|
| 1 | 230.1916 | 100.0000 | 0.0 |
| 2 | 0.0009 | 0.0004 | 58.5 |
| 3 | 11.5448 | 5.0153 | 0.0 |
| 4 | 0.0011 | 0.0005 | 116.4 |
| 5 | 11.5141 | 5.0020 | 180.0 |
| 6 | 0.0003 | 0.0001 | 115.5 |
| 7 | 11.4889 | 4.9910 | −0.0 |
| 8 | 0.0005 | 0.0002 | 13.1 |
| 9 | 11.4980 | 4.9950 | 180.0 |
| 10 | 0.0006 | 0.0003 | −97.3 |
| 11 | 0.0020 | 0.0009 | 17.1 |
| 12 | 0.0007 | 0.0003 | −153.2 |
| 13 | 0.0096 | 0.0042 | −167.2 |
| 14 | 0.0006 | 0.0003 | 47.5 |
| 15 | 0.0008 | 0.0003 | 115.1 |
| 16 | 0.0004 | 0.0002 | −23.0 |
| 17 | 0.0039 | 0.0017 | 29.3 |
| 18 | 0.0006 | 0.0003 | −161.6 |
| 19 | 0.0051 | 0.0022 | −161.9 |
| 20 | 0.0004 | 0.0002 | 69.9 |
| 21 | 0.0036 | 0.0016 | −166.9 |
| 22 | 0.0004 | 0.0002 | 15.4 |
| 23 | 0.0045 | 0.0020 | 28.1 |
| 24 | 0.0006 | 0.0002 | −152.6 |
| 25 | 0.0031 | 0.0013 | −166.7 |
| 26 | 0.0002 | 0.0001 | −118.2 |
| 27 | 0.0041 | 0.0018 | −152.2 |
| 28 | 0.0011 | 0.0005 | 44.8 |
| 29 | 0.0032 | 0.0014 | 37.3 |
| 30 | 0.0006 | 0.0003 | −100.1 |
| 31 | 0.0011 | 0.0005 | 42.9 |
| 32 | 0.0006 | 0.0003 | 161.1 |
| 33 | 0.0048 | 0.0021 | −151.0 |
| 34 | 0.0002 | 0.0001 | 65.3 |
| 35 | 0.0010 | 0.0004 | 30.8 |
| 36 | 0.0005 | 0.0002 | 26.9 |
| 37 | 0.0031 | 0.0013 | 32.7 |
| 38 | 0.0007 | 0.0003 | −125.9 |
| 39 | 0.0033 | 0.0014 | −160.7 |
| 40 | 0.0002 | 0.0001 | −131.2 |

TABLE 3

| Harmonic | Mag. (Irms) | Mag. (%) | Phase deg |
|---|---|---|---|
| 1 | 1.5616 | 100.00 | 0.0 |
| 2 | 0.0141 | 0.90 | 179.5 |
| 3 | 0.8342 | 53.42 | 180.0 |
| 4 | 0.0091 | 0.58 | 2.5 |
| 5 | 0.0365 | 2.33 | −177.6 |
| 6 | 0.0082 | 0.53 | −3.0 |
| 7 | 0.4397 | 28.15 | 0.4 |
| 8 | 0.0144 | 0.92 | −179.6 |
| 9 | 0.2726 | 17.45 | −179.2 |
| 10 | 0.0012 | 0.08 | 24.4 |
| 11 | 0.0735 | 4.71 | 177.6 |
| 12 | 0.0137 | 0.87 | −1.1 |
| 13 | 0.1883 | 12.06 | −0.3 |
| 14 | 0.0099 | 0.63 | −178.1 |
| 15 | 0.0345 | 2.21 | −178.2 |
| 16 | 0.0073 | 0.47 | 176.3 |
| 17 | 0.1258 | 8.06 | 179.4 |
| 18 | 0.0146 | 0.93 | −0.0 |
| 19 | 0.0967 | 6.19 | −0.1 |
| 20 | 0.0022 | 0.14 | −167.8 |
| 21 | 0.0468 | 3.00 | −1.3 |
| 22 | 0.0132 | 0.84 | 178.6 |
| 23 | 0.1065 | 6.82 | 179.5 |
| 24 | 0.0106 | 0.68 | 1.3 |
| 25 | 0.0229 | 1.47 | 0.9 |
| 26 | 0.0063 | 0.40 | −4.6 |
| 27 | 0.0768 | 4.92 | −0.8 |
| 28 | 0.0147 | 0.94 | 179.6 |
| 29 | 0.0652 | 4.17 | 179.6 |
| 30 | 0.0032 | 0.21 | 7.7 |
| 31 | 0.0277 | 1.77 | 178.5 |

TABLE 3-continued

| Harmonic | Mag. (Irms) | Mag. (%) | Phase deg |
|---|---|---|---|
| 32 | 0.0126 | 0.80 | −1.9 |
| 33 | 0.0736 | 4.71 | −0.7 |
| 34 | 0.0113 | 0.72 | −179.2 |
| 35 | 0.0200 | 1.28 | −180.0 |
| 36 | 0.0053 | 0.34 | 174.5 |
| 37 | 0.0531 | 3.40 | 179.0 |
| 38 | 0.0147 | 0.94 | −0.8 |
| 39 | 0.0501 | 3.21 | −0.7 |
| 40 | 0.0042 | 0.27 | −175.0 |

Figure 9:
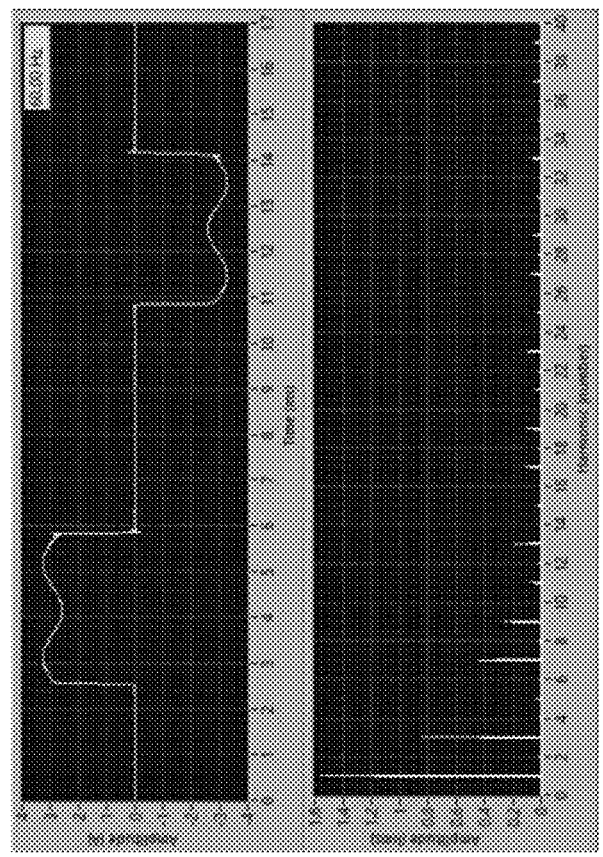
FIG. 9 is the graph showing the current harmonics generated from the current generator according to the invention (for the voltage in FIG. 8).
Figure 8:
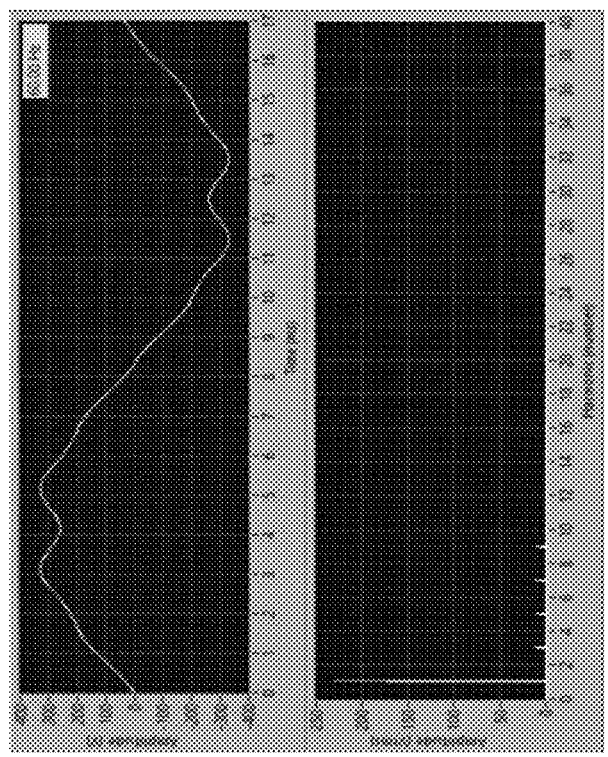
FIG. 8 is the graph showing the application of various voltage harmonics at 230 V (RMS) voltage, 60 Hz base frequency to the current generator according to the invention.
Figure 10:
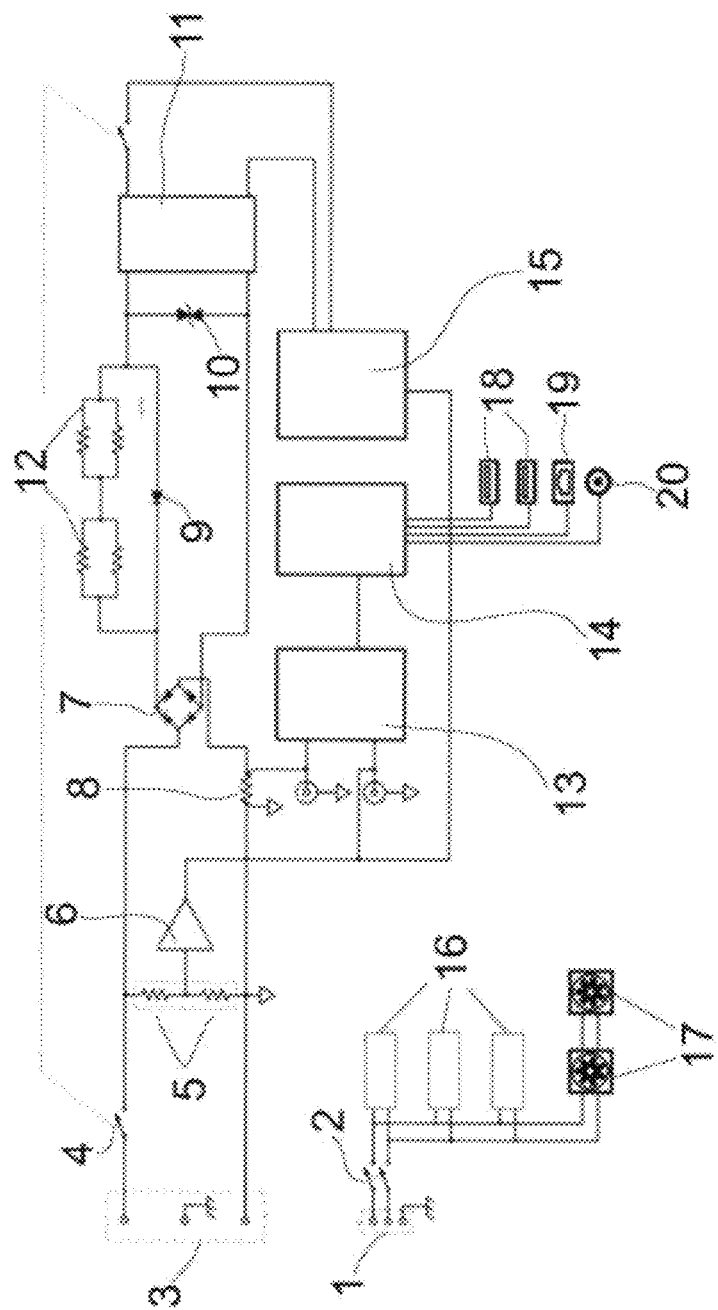
FIG. 10 is the block diagram showing the current generator according to the invention.
Figure 11:
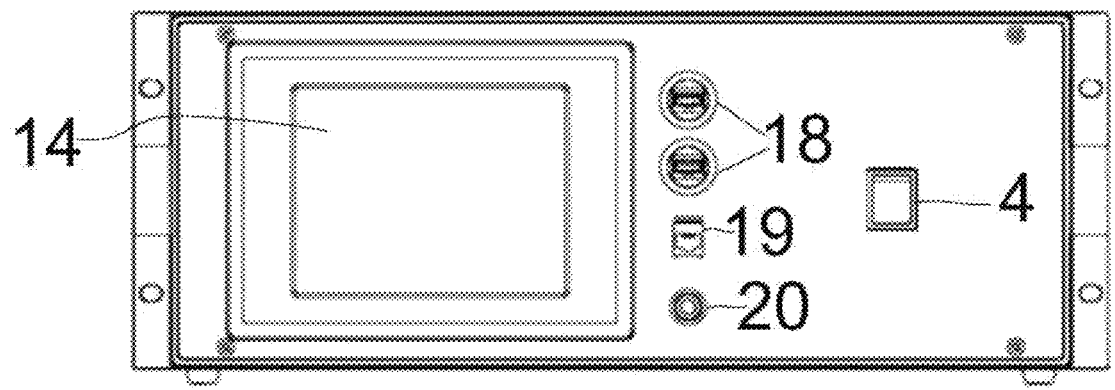
FIG. 11 is the front schematic view of the current generator according to the invention.
Figure 12:
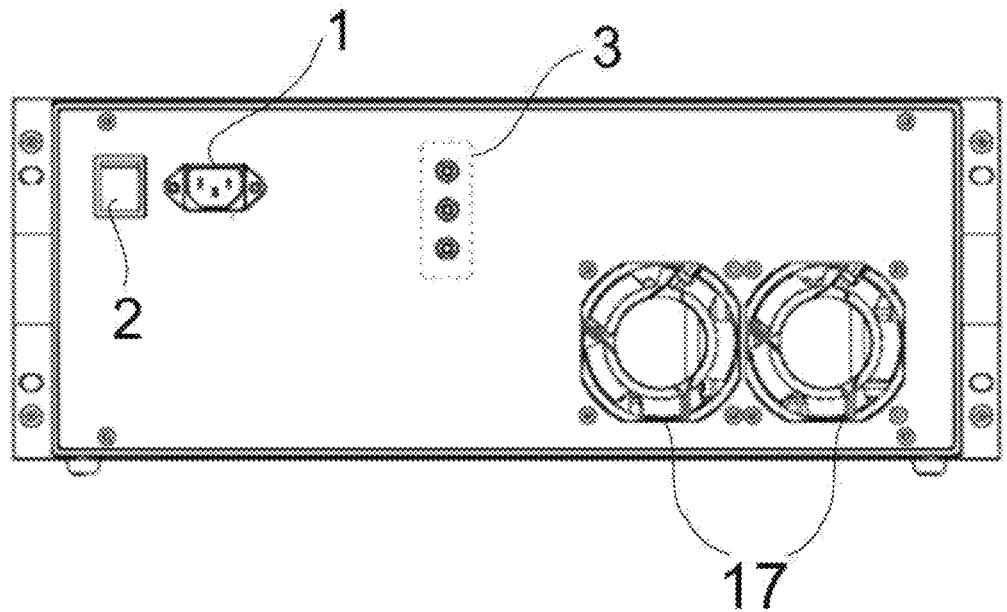
FIG. 12 is the rear schematic view of the current generator according to the invention.
Figure 13:
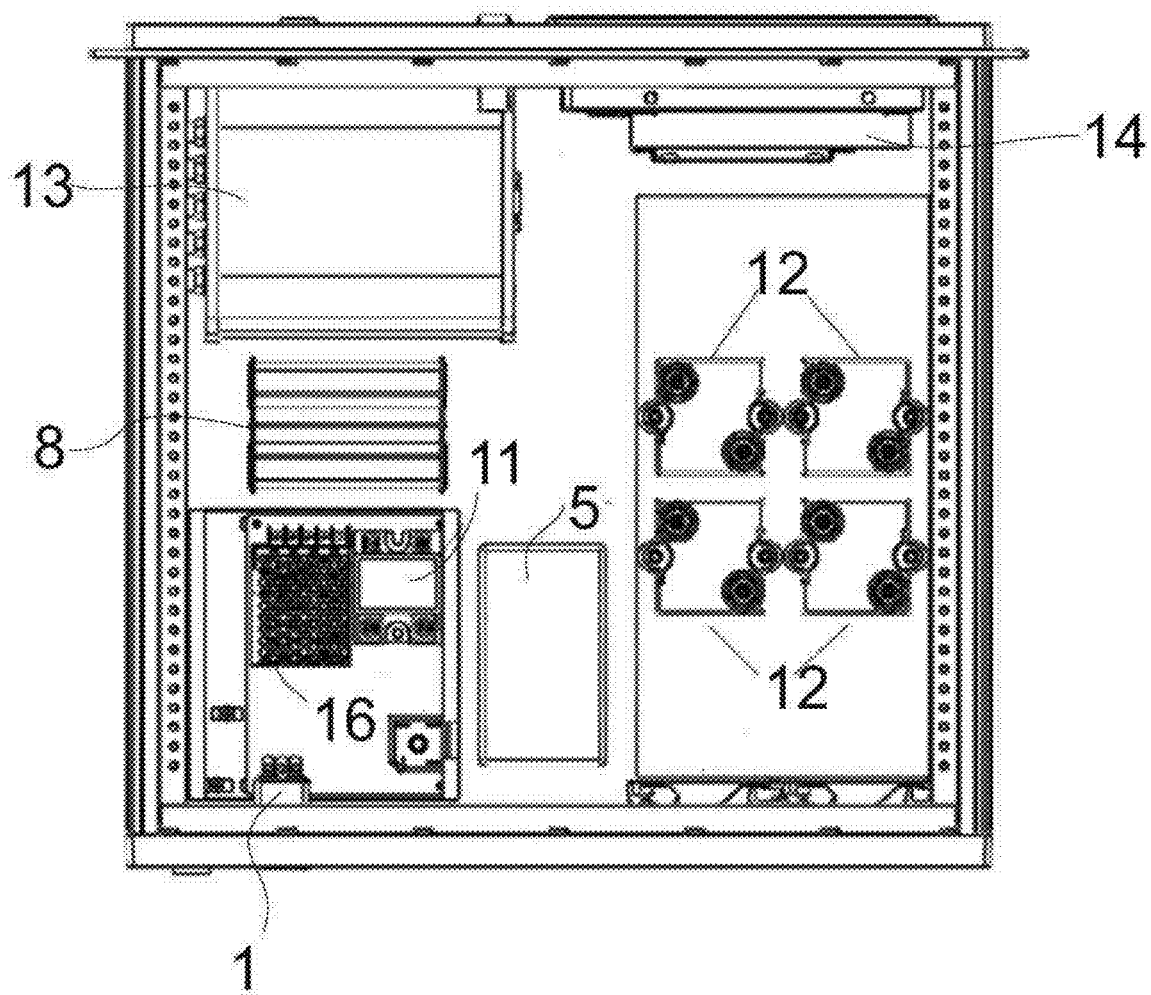
FIG. 13 is the top schematic view of the inside of the current generator according to the invention.
Figure 14:
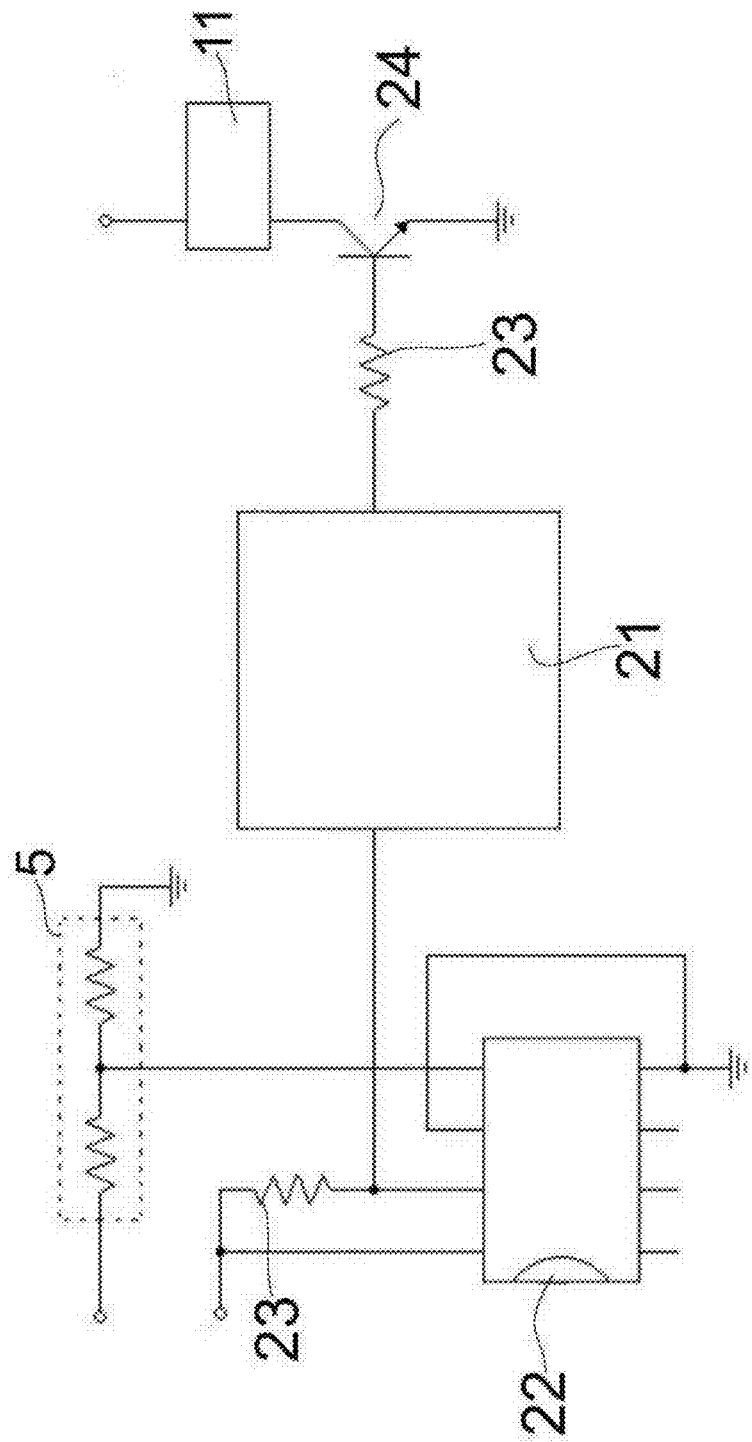
FIG. 14 is the schematic view of the microcontroller board disposed in the current generator according to the invention.
Figure 15:
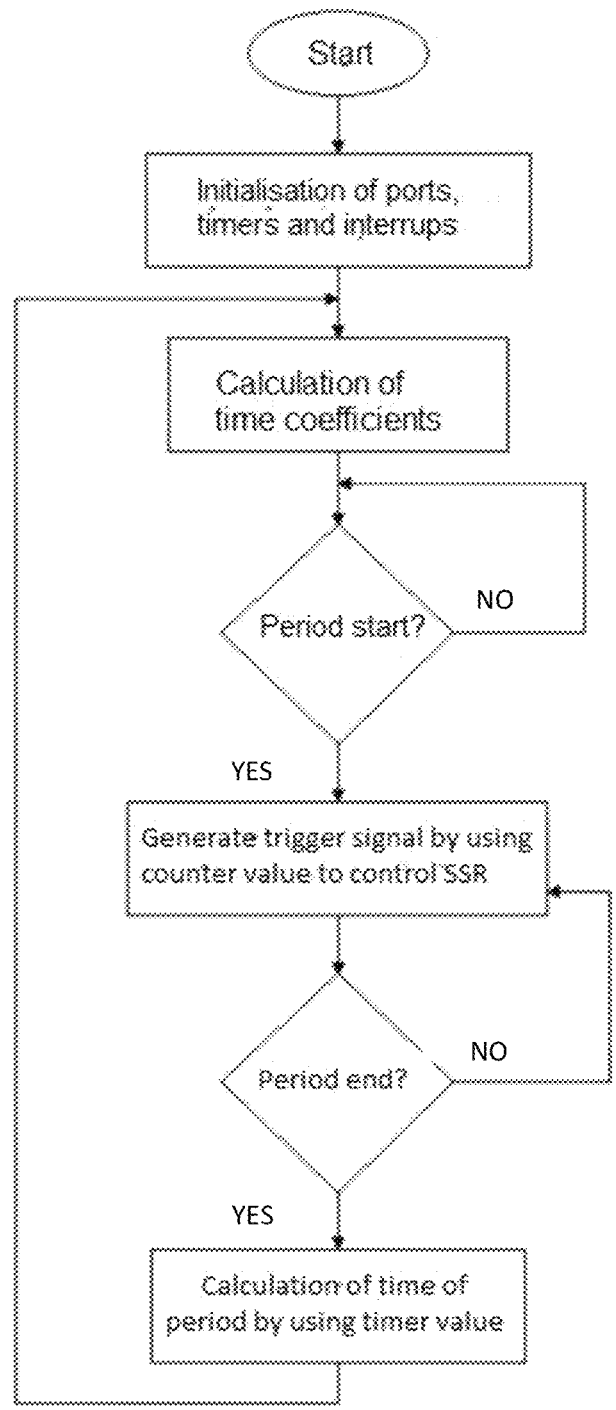
FIG. 15 is the flow diagram of the embedded software operating on the microcontroller board disposed in the current generator according to the invention.

The applied voltage and the withdrawn current when the output frequency of the power supply is changed to 60 Hz (without changing the voltage level and voltage harmonics) are shown in FIG. 8 and FIG. 9, respectively. Again, the applied voltage and the withdrawn current in this case are also shown in Table 4 and Table 5, respectively.

At this point, it will be observed that the maximum difference is approximately 0.15% when Table 3 and Table 5 are evaluated together and the change in the generated current harmonics is analyzed based on the frequency change.

TABLE 4

| Harmonic | Mag. (Vrms) | Mag. (%) | Phase (deg) |
|---|---|---|---|
| 1 | 230.1929 | 100.0000 | 0.0 |
| 2 | 0.0010 | 0.0004 | 69.4 |
| 3 | 11.5438 | 5.0148 | 0.0 |
| 4 | 0.0012 | 0.0005 | 119.4 |
| 5 | 11.5134 | 5.0016 | −180.0 |
| 6 | 0.0003 | 0.0001 | 64.4 |
| 7 | 11.4881 | 4.9906 | −0.0 |
| 8 | 0.0002 | 0.0001 | −6.9 |
| 9 | 11.4963 | 4.9942 | 180.0 |
| 10 | 0.0002 | 0.0001 | −19.0 |
| 11 | 0.0019 | 0.0008 | 20.2 |
| 12 | 0.0007 | 0.0003 | −145.8 |
| 13 | 0.0098 | 0.0043 | −164.1 |
| 14 | 0.0004 | 0.0002 | −21.9 |
| 15 | 0.0009 | 0.0004 | 85.3 |
| 16 | 0.0004 | 0.0002 | 0.7 |
| 17 | 0.0038 | 0.0016 | 35.5 |
| 18 | 0.0005 | 0.0002 | −178.6 |
| 19 | 0.0052 | 0.0023 | −156.3 |
| 20 | 0.0002 | 0.0001 | 58.2 |
| 21 | 0.0033 | 0.0014 | −166.7 |
| 22 | 0.0008 | 0.0004 | 41.8 |
| 23 | 0.0047 | 0.0020 | 33.2 |
| 24 | 0.0010 | 0.0004 | −128.3 |
| 25 | 0.0033 | 0.0014 | −170.7 |
| 26 | 0.0003 | 0.0001 | 134.9 |
| 27 | 0.0042 | 0.0018 | −146.3 |
| 28 | 0.0009 | 0.0004 | 41.6 |
| 29 | 0.0033 | 0.0015 | 28.9 |
| 30 | 0.0006 | 0.0003 | −115.1 |
| 31 | 0.0009 | 0.0004 | 63.3 |
| 32 | 0.0006 | 0.0003 | −169.7 |
| 33 | 0.0046 | 0.0020 | −151.2 |
| 34 | 0.0005 | 0.0002 | 30.2 |
| 35 | 0.0008 | 0.0003 | 69.0 |
| 36 | 0.0010 | 0.0004 | 73.8 |
| 37 | 0.0038 | 0.0016 | 34.0 |
| 38 | 0.0011 | 0.0005 | −143.3 |
| 39 | 0.0040 | 0.0017 | −153.4 |
| 40 | 0.0003 | 0.0001 | −12.9 |

TABLE 5

| Harmonic | Mag. (Irms) | Mag. (%) | Phase (deg) |
|---|---|---|---|
| 1 | 1.5591 | 100.00 | 0.0 |
| 2 | 0.0147 | 0.94 | 179.1 |
| 3 | 0.8347 | 53.54 | 180.0 |
| 4 | 0.0095 | 0.61 | 3.7 |
| 5 | 0.0338 | 2.17 | −175.9 |
| 6 | 0.0085 | 0.54 | −4.6 |
| 7 | 0.4385 | 28.12 | 0.6 |
| 8 | 0.0150 | 0.96 | −179.5 |
| 9 | 0.2744 | 17.60 | −178.7 |
| 10 | 0.0015 | 0.10 | 30.8 |
| 11 | 0.0714 | 4.58 | 176.2 |
| 12 | 0.0142 | 0.91 | −1.7 |
| 13 | 0.1887 | 12.10 | −0.4 |
| 14 | 0.0105 | 0.67 | −177.4 |
| 15 | 0.0371 | 2.38 | −177.4 |
| 16 | 0.0074 | 0.47 | 174.1 |
| 17 | 0.1246 | 7.99 | 179.0 |
| 18 | 0.0152 | 0.98 | −0.2 |
| 19 | 0.0984 | 6.31 | −0.1 |
| 20 | 0.0027 | 0.17 | −164.2 |
| 21 | 0.0445 | 2.85 | −2.2 |
| 22 | 0.0135 | 0.87 | 177.7 |
| 23 | 0.1066 | 6.84 | 179.2 |
| 24 | 0.0114 | 0.73 | 1.8 |
| 25 | 0.0253 | 1.63 | 1.1 |
| 26 | 0.0062 | 0.40 | −7.3 |
| 27 | 0.0754 | 4.84 | −1.3 |
| 28 | 0.0153 | 0.98 | 179.2 |
| 29 | 0.0667 | 4.28 | 179.3 |
| 30 | 0.0039 | 0.25 | 9.7 |
| 31 | 0.0253 | 1.62 | 177.6 |
| 32 | 0.0128 | 0.82 | −3.0 |
| 33 | 0.0735 | 4.71 | −1.2 |
| 34 | 0.0121 | 0.78 | −179.1 |
| 35 | 0.0223 | 1.43 | 179.9 |
| 36 | 0.0050 | 0.32 | 170.8 |
| 37 | 0.0515 | 3.30 | 178.4 |
| 38 | 0.0153 | 0.98 | −1.3 |
| 39 | 0.0513 | 3.29 | −1.2 |
| 40 | 0.0050 | 0.32 | −173.7 |

The invention claimed is:

1. A frequency adaptive harmonic current generator for generation of harmonic currents, comprising:
   a microcontroller board for controlling the generation of harmonic currents and a frequency adaptive operating function, wherein the frequency adaptive operating function enables continuously generation of harmonic currents at different frequencies;
   an electronic relay controlled and switched over a digital output of a microcontroller, a resistor and a transistor, wherein the electronic relay provides a steady duty cycle necessary for the generation of harmonic currents at different frequencies;
   a data collection unit, wherein, a voltage divider, a buffer and a current shunt are connected to the data collection unit for measurements of voltage and current harmonics, wherein, the data collection unit is configured to read current and voltage values and transfers the current and voltage values to a panel type computer; and
   the panel type computer includes a software for making, presenting and recording the measurements; external connections of the panel type computer are made through by USB connectors and a LAN connector; the panel type computer is configured to display the measurements to a user and has a push-button for switching on/off operations.

2. The frequency adaptive harmonic current generator according to claim 1, further comprising a main power input to supply switching mode power supplies and cooling fans.

3. The frequency adaptive harmonic current generator according to claim 2, further comprising a harmonic current withdrawal input for applying voltage sources with different voltage and frequency values.

4. The frequency adaptive harmonic current generator according to claim 1, further comprising a harmonic on/off switch for switching on/off the generation of current harmonics.

5. The frequency adaptive harmonic current generator according to claim 1, further comprising a bridge type rectifier between a harmonic current withdrawal input and a resistive load in order to generate unidirectional currents at the resistive load.

6. The frequency adaptive harmonic current generator according to claim_1, further comprising a power on/off switch as a main on/off switch of the frequency adaptive harmonic current generator.

7. The frequency adaptive harmonic current generator according to claim 2, further comprising a harmonic on/off switch for switching on/off the generation of current harmonics.

8. The frequency adaptive harmonic current generator according to claim 3, further comprising a harmonic on/off switch for switching on/off the generation of current harmonics.

9. The frequency adaptive harmonic current generator according to claim 2, further comprising a bridge type rectifier between a harmonic current withdrawal input and a resistive load in order to generate unidirectional currents at the resistive load.

10. The frequency adaptive harmonic current generator according to claim 3, further comprising a bridge type rectifier between a harmonic current withdrawal input and a resistive load in order to generate unidirectional currents at the resistive load.

11. The frequency adaptive harmonic current generator according to claim 4, further comprising a bridge type rectifier between a harmonic current withdrawal input and a resistive load in order to generate unidirectional currents at the resistive load.

12. The frequency adaptive harmonic current generator according to claim 2, further comprising a power on/off switch as a main on/off switch of the frequency adaptive harmonic current generator.

13. The frequency adaptive harmonic current generator according to claim 3, further comprising a power on/off switch as a main on/off switch of the frequency adaptive harmonic current generator.

14. The frequency adaptive harmonic current generator according to claim 4, further comprising a power on/off switch as a main on/off switch of the frequency adaptive harmonic current generator.

15. The frequency adaptive harmonic current generator according to claim 5, further comprising a power on/off switch as a main on/off switch of the frequency adaptive harmonic current generator.

\* \* \* \* \*